(12) United States Patent
Perry et al.

(10) Patent No.: US 9,431,298 B2
(45) Date of Patent: Aug. 30, 2016

(54) INTEGRATED CIRCUIT CHIP CUSTOMIZATION USING BACKSIDE ACCESS

(75) Inventors: Daniel W. Perry, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 759 days.

(21) Appl. No.: 12/939,439

(22) Filed: Nov. 4, 2010

(65) Prior Publication Data
US 2012/0112312 A1    May 10, 2012

(51) Int. Cl.
| | | |
|---|---|---|
| H01L 23/52 | (2006.01) | |
| H01L 21/768 | (2006.01) | |
| G11C 11/16 | (2006.01) | |
| G11C 13/00 | (2006.01) | |
| G11C 17/16 | (2006.01) | |
| H01L 23/525 | (2006.01) | |

(52) U.S. Cl.
CPC ......... *H01L 21/76898* (2013.01); *G11C 11/16* (2013.01); *G11C 13/0002* (2013.01); *G11C 17/16* (2013.01); *H01L 23/5256* (2013.01); *H01L 2924/0002* (2013.01)

(58) Field of Classification Search
CPC ................................................ H01L 21/76898
USPC ....................................................... 257/530
See application file for complete search history.

(56) References Cited

U.S. PATENT DOCUMENTS

| | | |
|---|---|---|
| 3,648,131 A | 3/1972 | Stuby |
| 5,184,043 A | 2/1993 | Yoshinaga |
| 6,168,969 B1 * | 1/2001 | Farnworth ................... 438/106 |
| 6,400,008 B1 | 6/2002 | Farnworth |
| 6,734,474 B2 | 5/2004 | Frankowsky |
| 7,466,028 B1 * | 12/2008 | Yu et al. ...................... 257/774 |
| 7,494,846 B2 | 2/2009 | Hsu et al. |
| 7,518,398 B1 | 4/2009 | Rahman et al. |

(Continued)

FOREIGN PATENT DOCUMENTS

| | | |
|---|---|---|
| JP | 2087812 A | 3/1990 |
| JP | 2010225259 A | 10/2010 |
| WO | WO-2009150814 A1 | 12/2009 |

OTHER PUBLICATIONS

Foden P. R. et al., "A releasable data capsule for the deep ocean", OCEANS '95 MTS/IEEE challenges of our changing global environment conference proceedings San Diego, CA, USA Oct. 9-12, 1995, NY, USA, IEEE, US, Oct. 9, 1995, pp. 1240-1246, vol. 2, XP010197534, DOI: 10.1109/OCEANS.1995.528598, ISBN: 978-0-933957-14-5.

(Continued)

*Primary Examiner* — Marc Armand
*Assistant Examiner* — Sarah Salerno
(74) *Attorney, Agent, or Firm* — Michelle S. Gallardo

(57) ABSTRACT

An integrated circuit, a method for making an integrated circuit product, and methods for customizing an integrated circuit are disclosed. Integrated circuit elements including programmable elements, such as fuses, PROMs, RRAMs, MRAMs, or the like, are formed on the frontside of a substrate. Vias are formed through the substrate from its frontside to its backside to establish conduction paths to at least some of the programmable elements from the backside. A programming stimulus is applied to at least some of the vias from the backside to program at least some of the frontside programmable elements.

66 Claims, 4 Drawing Sheets

(56) References Cited

U.S. PATENT DOCUMENTS

| | | | |
|---|---|---|---|
| 7,701,252 B1* | 4/2010 | Chow | H01L 25/0657 326/101 |
| 7,998,853 B1* | 8/2011 | Rahman | H01L 21/76898 257/E21.499 |
| 2001/0045645 A1 | 11/2001 | Sasaki et al. | |
| 2005/0010725 A1* | 1/2005 | Eilert | 711/132 |
| 2005/0167825 A1 | 8/2005 | Pharn et al. | |
| 2008/0153204 A1* | 6/2008 | Jackson et al. | 438/109 |
| 2008/0157350 A1* | 7/2008 | Cheah et al. | 257/713 |
| 2008/0220565 A1* | 9/2008 | Hsu et al. | 438/109 |
| 2009/0065951 A1 | 3/2009 | Cheah et al. | |
| 2009/0135638 A1* | 5/2009 | Shimizu | 365/51 |
| 2010/0181041 A1 | 7/2010 | Renkel | |
| 2010/0182040 A1* | 7/2010 | Feng et al. | 326/38 |
| 2010/0182041 A1 | 7/2010 | Feng et al. | |
| 2010/0182042 A1* | 7/2010 | Law et al. | 326/38 |
| 2010/0220517 A1 | 9/2010 | Okayama | |
| 2010/0246152 A1* | 9/2010 | Lin et al. | 361/783 |
| 2010/0321095 A1 | 12/2010 | Mikawa et al. | |

OTHER PUBLICATIONS

International Search Report and Written Opinion—PCT/US2011/059245—ISA/EPO—Feb. 23, 2012.

Cheng-Wen Wu, "What We Have Learned from SOC Is What Is Driving 3D Integration", ITRI/NTHU, Mar. 12, 2010, pp. 1-46.

"Via (electronics)" Wikipedia, the free encyclopedia, http://en.wikipedia.org/wiki/Via_(electronics) [Aug. 29, 2010 11:48:44 AM], 2 pages.

\* cited by examiner

INTEGRATED CIRCUIT CHIP CUSTOMIZATION USING BACKSIDE ACCESS

FIELD

The various embodiments described herein relate in general to improvements in semiconductor fabrication processes, products, and devices, and, more specifically, to methods for making programmable semiconductor integrated circuits, methods for programming same, and integrated semiconductor products made thereby.

BACKGROUND

As semiconductor integrated circuit products become more and more sophisticated, manufacturers continue to look for ways to increase the usefulness of particular circuit designs without having to continually redesign circuits as that have common elements. For example, many times circuit has different circuit elements on a single chip that can be enabled by activating a programmable element, such as a fuse, anti-fuse, programmable read-only memory (PROM), resistive random-access memory (RRAM), magnetic random-access memory (MRAM), or the like.

At she same time, manufacturers are seeking ways to construct packaged integrated circuit products in smaller or more compact packages. One way this has been accomplished is to stack integrated circuit chips, or dies, one on she other, with signals being conducted among the chips by vias in each chip to contact a conductor of the adjacent chip. (The term "via" is used herein to mean a structure having a conductor formed in a substrate through hole, wish conductor portions exposed on each side of the substrate, thereby forming a through connector in the substrate.) Often the vias are in a predetermined pattern so that the via pattern of one chip aligns with the via pattern of an adjacent chip so that when the chips are stacked, electrical connections between the chips are established.

This has led to the development of a three-dimensional approach, including multiple chip or die stacking and wafer stacking. Multiple substrates that include through-silicon-vias, or TSVs, can be stacked on one another to achieve such three dimensional integration. In particular, the TSVs of different substrates can conduct signals from one substrate to another without the use of, for example, wires or other conductors.

Nevertheless, typically, hundreds or thousands of integrated circuits are constructed on a large semiconductor wafer, for example, of 12 inches in diameter. The integrated circuits are patterned into chips which will be cleft from the wafer into individual chips, or dies. Each of the chips on the wafer has a number of bonding pads to which electrical connections to the integrated circuits ultimately will be made. The bonding pads are typically formed on the frontside of the chips (i.e., the side of the chip on which the transistors of the integrated circuit are formed). In many cases, the chips are made larger than they otherwise would be in order to accommodate the large number of bonding pads.

The bonding pads are also used during fabrication for testing of the integrated circuits on the chips and for enabling programming of programmable elements that may be included on she chips. During this time, for example, if a particular circuit is found to be non-functional, the programmable elements may be activated from the frontside bonding pads, for example, by blowing a fuse or activating an antifuse, to remove the nonfunctional circuit or reroute signals around it. Typically, the programming is done during fabrication and testing, before the chips are assembled into a stacked, mounted, or packaged product.

Once a stack of chips is fabricated, it becomes impractical to address programmable elements on the chips. For example, in a stack of identical chips, blowing a fuse on one chip at a particular level will result in fuses in the same location on other chips in the stack being blown. This problem can be addressed using more complex metallization patterns, but it can be seen that the complexity of the overall structure is also significantly increased, and is not done because of the expense of the mask sets used in fabrication.

Moreover, using standard programming techniques, programming signals are limited in the amount of voltage or current that can be applied because the programming is done from pads on the frontside that are not necessarily located in close proximity to the element to be programmed and the programming signals may be conducted through lengthy signal path conductors to the programmable elements. This often results in incomplete or ineffective programming, since the application of a specified programming voltage or current may not be sufficient to cause the corresponding programmable element so change state.

System-on-chip (SOC) products use fuses and PROMs to program functionality, enable redundancy, or for product identification and serialization. It is expected that three-dimensional (3D) products will have increased need for product customization and/or redundancy/repair schemes, with an accompanying high price in I/O requirements.

What is needed, therefore, is a structure and method by which device programming can be achieved that can reliably program programmable elements on a chip and which enables the use of fewer bonding pads.

SUMMARY

An example of one integrated circuit embodiment is disclosed having a substrate with front and backsides. At least one programmable element, such as a fuse, antifuse, PROM, RRAM, MRAM, or the like, is located on the frontside, and vias through the substrate provide access from the backside to the programmable element on the frontside, wherein the programmable element is programmable by a voltage, current, or programming stimulus selectively applied to the conductors from the backside. The substrate may be, for example, silicon, and the vias may be, for example, TSVs.

An example an embodiment of a method for customizing an integrated circuit includes providing substrate having front and backsides. Vias are formed through the substrate to provide access from the backside to a programmable element, such as a fuse, antifuse, PROM, RRAM, MRAM, or the like, on the frontside, and a programming stimulus is applied to the conductors from the backside to program the programmable element to establish a functionality, such a configuration or repair, of the integrated circuit. The substrate may be silicon, and the vies may be TSVs.

Another example of an embodiment of a method for customizing an integrated circuit includes providing a substrate having front and backsides. Vias are formed through the substrate to provide access from the backside so a programmable element, such as a fuse, antifuse, PROM, RRAM, MRAM, or the like, on the frontside. A programming stimulus is applied to the conductors from the backside to program the programmable element to uniquify the integrated circuit. The substrate may be silicon, and the vies and conductors may be TSVs. The integrated circuit may be uniquified, for example, by creating a serialization or identification of the integrated circuit.

An example of an embodiment of a method for making an integrated circuit product includes forming integrated circuit elements including programmable elements, such as fuses, PROM, RRAMs, MRAMs, or the like, on the frontside of a substrate. Vias are formed extending through the substrate from its frontside to its backside. Metallization traces are formed on the frontside and the backside to establish conduction paths from the backside through the vias to at least some of the programmable elements on the frontside. A programming stimulus is applied to at least some of the backside metallization traces to program at least some of the frontside programmable elements.

An example is disclosed of an integrated circuit product that is made by the process including providing a substrate having a frontside and a backside and forming vies in the substrate to provide electrical connections from the backside to a programmable element on the frontside. The vies are arranged such that the programmable element can be programmed by application of a programming stimulus to the vias from said backside to establish a functionality of the integrated circuit.

Another example of an integrated circuit includes means for providing a programmable element on a frontside of a substrate and means for establishing vies extending from the frontside to a backside of the substrate. The vies are arranged to enable the programmable element to be programmed by application of a programming stimulus to the vias from the backside to establish a functionality of said integrated circuit.

BRIEF DESCRIPTION OF THE DRAWING

In the various figures of the drawing, like reference numbers are used to denote like or similar parts.

DETAILED DESCRIPTION

Figure 1:
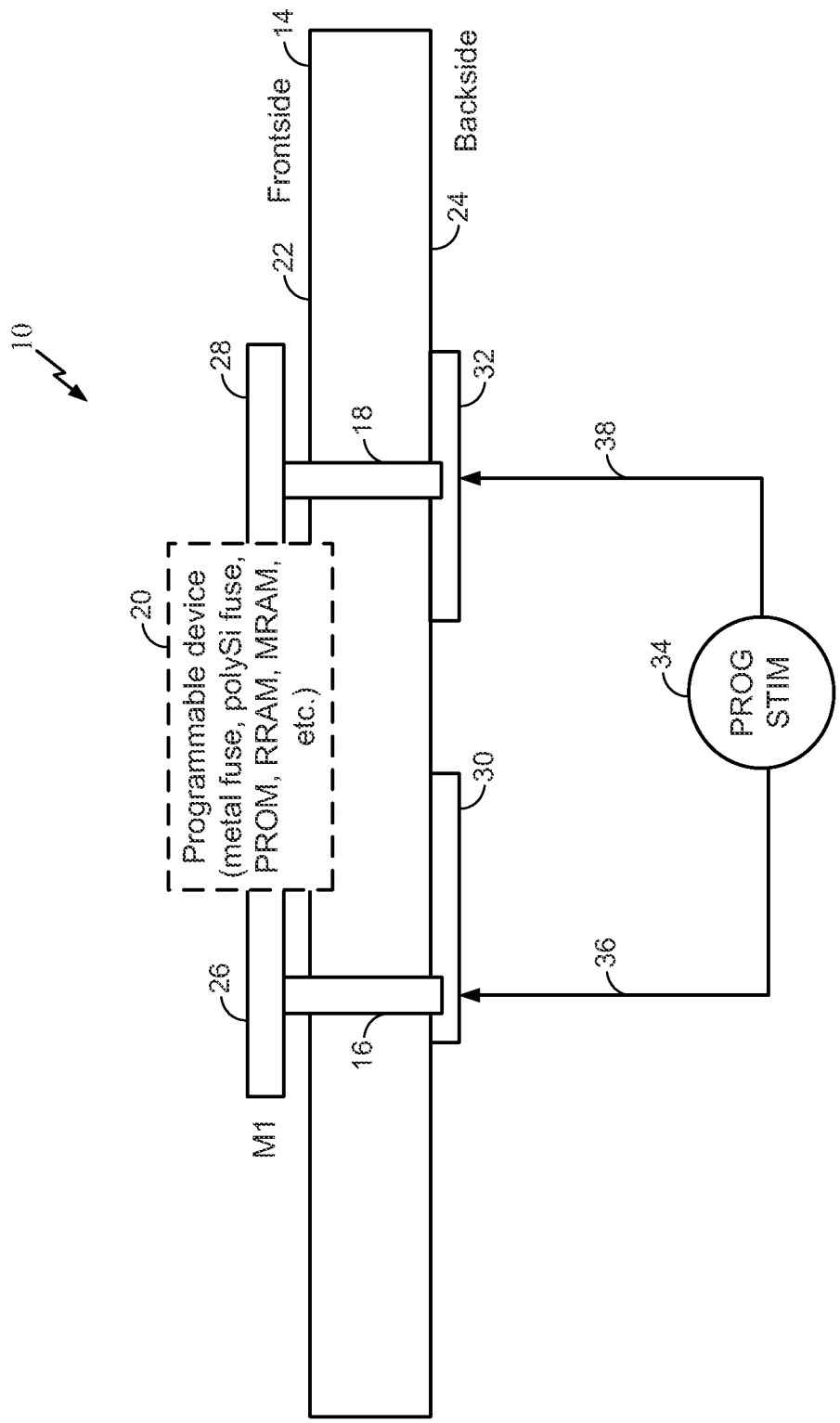
FIG. 1 is a cut away side view of a portion of a semiconductor chip illustrating programming of frontside programmable elements from a backside of the chip using TSVs.

An example of one embodiment 10 of an integrated circuit structure in which backside TSV programming may be accomplished is shown in FIG. 1, to which reference is now made. It should be noted that although the illustrative embodiment 10 is described in terms of through-silicon-vias, or TSVs, it is not intended that the example be limited to silicon substrates or TSVs, and may be equally advantageously practiced with other semiconductor processes, materials, or the like. For example the substrate 14 can be of any appropriate substrate material, such as gallium arsenide, indium phosphide, silicon germanium, gallium indium arsenide, silicon on glass, silicon on sapphire, silicon on ceramic, glass, sapphire, ceramic, laminates, Bismaleimide-Triazine (BT), FR4, epoxy, epoxy blends, and the like. Additionally, although TSVs are described in the embodiment illustrated, any suitable via may be used that is consistent with the substrate material.

The words "example" or "exemplary" are used to mean "serving as an instance, illustration, nature, or character of the rest," Any embodiment described herein as "an example" or "exemplary" is not necessarily to be construed as preferred or advantageous over other embodiments.

The embodiment 10 illustrated in FIG. 1 shows a cutaway portion of a semiconductor substrate 14, which may be silicon, for example, having through-silicon-vias, or TSVs, 16 and 18 therethrough. Each TSV includes a conductor, such as tungsten, aluminum, copper, or the like, having low resistance, typically less than one ohm, and a high voltage and current carrying capacity, formed in a respective substrate through hole extending between the frontside 22 and backside 24 of the substrate 14. TSVs may also be constructed with a polysilicon conductors.

TSVs may be formed in any location where an electrical conduction path may be established. For example, TSVs 16 and 18 are formed to enable electrical conduction paths to be established from the backside 24 or the substrate 14 to programmable elements 20 on the frontside of the substrate 14, as described below in greater detail. It should be noted that the terms "frontside" and "backside" are not intended to necessarily indicate a direction or orientation of actual surfaces or substrate sides in practice, but merely to identify the surfaces or sides illustrated in the drawing. The term "frontside" herein refers to the side of the wafer receiving standard device process steps, such as the fabrication of transistors, active and passive devices, metal level Cu or Al lateral interconnects, and the like. The term "backside" herein refers to a side opposite the frontside.

There are many approaches used in the formation of TSVs. In one approach, TSVs are formed through the substrate before other processes, such as active device fabrication and metallization processes. According to this approach, vias are formed only partially penetrating into the substrate from the frontside. Later the substrate is thinned or lapped from the backside to expose the vias.

According to another approach, the vias are formed after active devices have been fabricated and other back end or bonding processes have been completed. For example, in this approach, vias are formed from the backside of the wafer after the wafer has been thinned.

According to still another approach, TSVs are formed after the transistors are fabricated, and before the wiring or interconnects are fabricated. Thus, after the transistors and other devices are formed on the substrate. The TSVs may be formed partially penetrating the substrate. Then, a thinning process may be performed to expose the TSVs from the backside of the wafer to complete the TSV construction. It should be appreciated that there are a number of possible times during the wafer processing at which the TSVs may be formed, but the final result is that the TSVs are accessible from the backside of the wafer, and according to the embodiments described herein, there are no other restrictions as to which TSV fabrication approach is taken.

At least one programmable element or device 20 is formed in frontside of the substrate 14. The programmable element 20 may be, for example, a fuse, an antifuse, a programmable read-only memory (PROM), a resistive random-access memory (RRAM), a magnetic random-access memory (MRAM), or the like. It should be noted that the programmable element 20 contemplated in this embodiment is of the type that affects the structure, functionality, or configuration of the integrated circuit formed in the substrate 14, or that uniquifies the substrate itself, such as by a serialization designation, 3D level identification in a stack of substrates, or the like. It is not intended that the programmable element be of the type that is programmable as a part of the normal operation of the integrated circuit of which it is a part. For example, functionality examples may include enabling a block of circuitry for a higher priced part, disabling a block of circuitry for a lower priced part, making a better or lesser performing part, providing different functionality for different parts of the world, for instance, to comply with regulatory requirements, and the like.

Conductive contacts, or pads, 26 and 28 on the frontside surface 22 of the substrate 14 connect to the programmable element 20 on one side and respective TSVs 16 and 18 on their other sides. The pads 26 and 28 may be a part of a metallization trace, for example a first level metal (M1) of aluminum, copper, tungsten, or the like, formed on the substrate 14. Of course, the pads 26 and 28 may be formed during the processing of other metallization layers.

In a similar manner, flat conductive contacts, or pads, 30 and 32 on the backside surface 24 of the substrate connect to the respective TSVs 16 and 18 to aid in establishing programming contact to the vias and frontside programmable elements. The pads 30 and 32 may also be a part of a metallization trace or other conductor, such as doped polysilicon, or the like, formed on the substrate 14. In some embodiments, the flat conductive contacts, or pads, 30 and 32, may not necessarily be employed, but instead, programming contacts may be made directly to the TSVs, for example, by a probe or nail, from the backside of the substrate 14.

The programmable element 20 is programmed, if desired, by applying a programming stimulus from a voltage, current, or other programming stimulus source 34 to the backside pads 30 and 32, for example by conductive probes or contacts 36 and 38. There are essentially no restrictions as to when the programmable element 20 may be programmed as long as the processing has progressed to the point where the TSVs are exposed. For example, it may be programmed before the individual chips or dies are cleft, during the chip or die stage before assembly, or after the assembly stage if the backside TSV pads remain accessible to the conductive probes or contacts 36 and 38. Of course, the TSVs may be accessed indirectly, for example, through an interposer, intermediate wiring from another chip level, package pins, a package substrate, or other means.

It should be understood that although only a single programmable element 20 is shown in FIG. 1, a typical configurable integrated circuit product may have tens or hundreds of programmable elements. In fact, one of the advantages of the embodiments described herein is that by virtue of TSVs that may be placed essentially anywhere on the backside of the substrate 14, almost any number of programmable elements can be employed, limited only by the frontside space of the substrate 14 available to contain the programmable elements.

Moreover, because the TSVs are accessible from the backside, a potential exists to reduce the number of bonding pads on the frontside, which may lead to a reduction in the size of the chip or die. Additionally, some programmable devices may be allowed in keep out areas (the areas around a TSV in which no circuitry is generally allowed), further reducing area impact and reducing the size of the final integrated circuit.

Thus, according to one embodiment described herein, programmable devices such as fuses, antifuses, PROMs, RRAMs, MRAMs, and the like, are accessed from the backside of the wafer using through silicon vias (TSVs). Contact to the TSVs can be direct contact to a conductive "nail", or using a pad of copper, aluminum, tungsten, or other conductive material on the backside of the wafer for a larger contact area, as shown.

TSVs have large voltage and current carrying capacity compared to frontside input/output (I/O) pads, which have traditionally been used for programmable circuit configuration. This enables different types of programmable devices to be used than those for which use was constrained in the past. With reduced or no need for frontside I/O pads, there can be orders of magnitude larger number of programmable elements. TSV placement is more flexible than I/O placement, allowing easier access to circuit elements. TSVs can be placed at nearly any location in die, allowing convenient access to all circuits and blocks.

Through the use of backside programming using TSVs for functionality configuration, many types of modifications can be made no prefabricated integrated circuits. TSV programmability will allow changing the usage of individual TSVs to support product customization or stacking of different components on a "mother die," for example, by programming the mother die to allow usage with different stacked components. Backside TSV contacts can be used to access a fuse or other programmable element in the substrate to effect repair or redundancy, to enable or disable functionality, to provide product serialization, to enable stacking options, and the like. This enables, as one of many examples, multiple DRAM suppliers to be supported.

It should be noted that backside TSV contacts can be sacrificial, that is, used only for programming. Alternatively, the backside TSV contacts can be used to determine the functionality of a TSV in a stacked product. Moreover, a TSV and its associated "keep out area" is smaller than an I/O pad.

Figure 2:
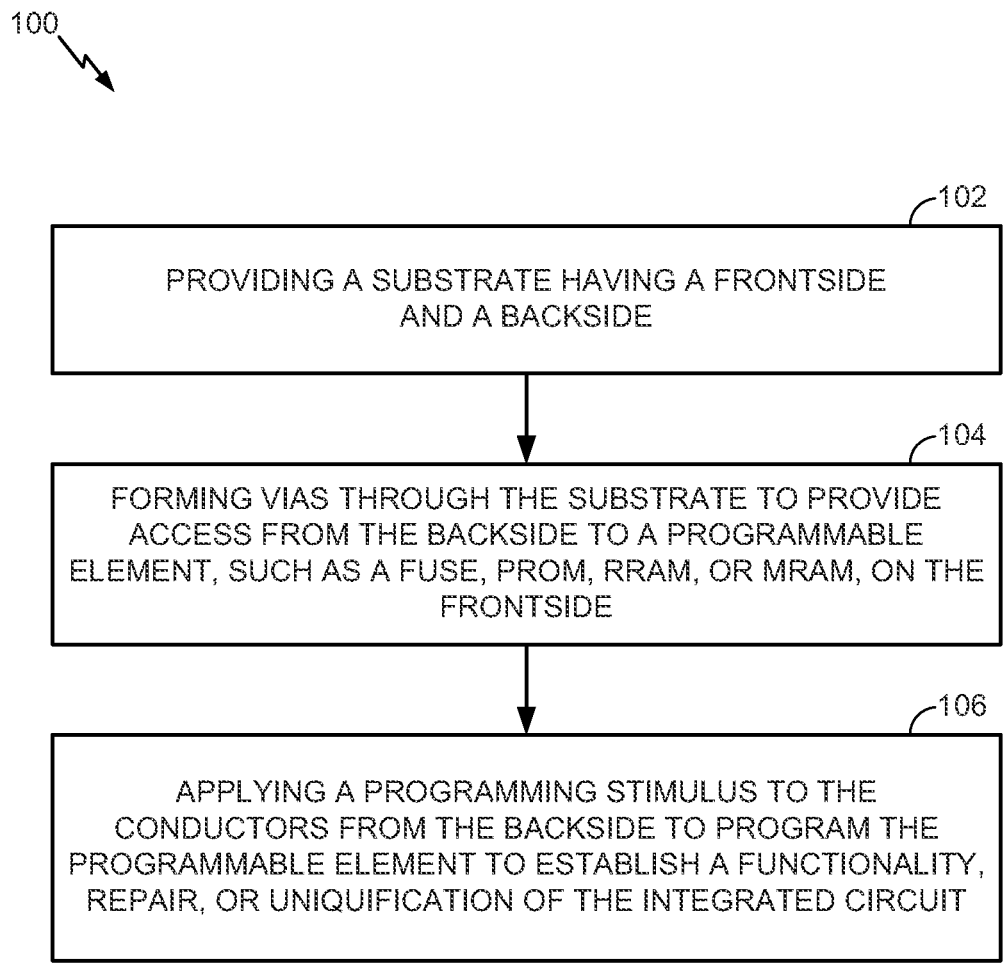
FIG. 2 is a flow diagram showing steps in a method for customizing an integrated circuit having elements on a frontside of a semiconductor chip that may be programmed using backside TSV contacts.

An embodiment of a method 100 for customizing an integrated circuit using this TSV approach is shown in FIG. 2, to which reference is now additionally made. The method includes providing 102 a substrate having a frontside and a backside. Vias are formed 104 through the substrate to provide access from the backside of the substrate to contact a programmable element, such as fuse, antifuse, PROM, RRAM, MRAM, or the like, on said frontside of the substrate. A programming stimulus, such as a voltage or current, is applied 106 to the conductors from the backside of the substrate to program the programmable element to establish a functionality, serialization, or uniquification of the integrated circuit. The functionality may also include, for example, a repair of the integrated circuit.

Figure 3:
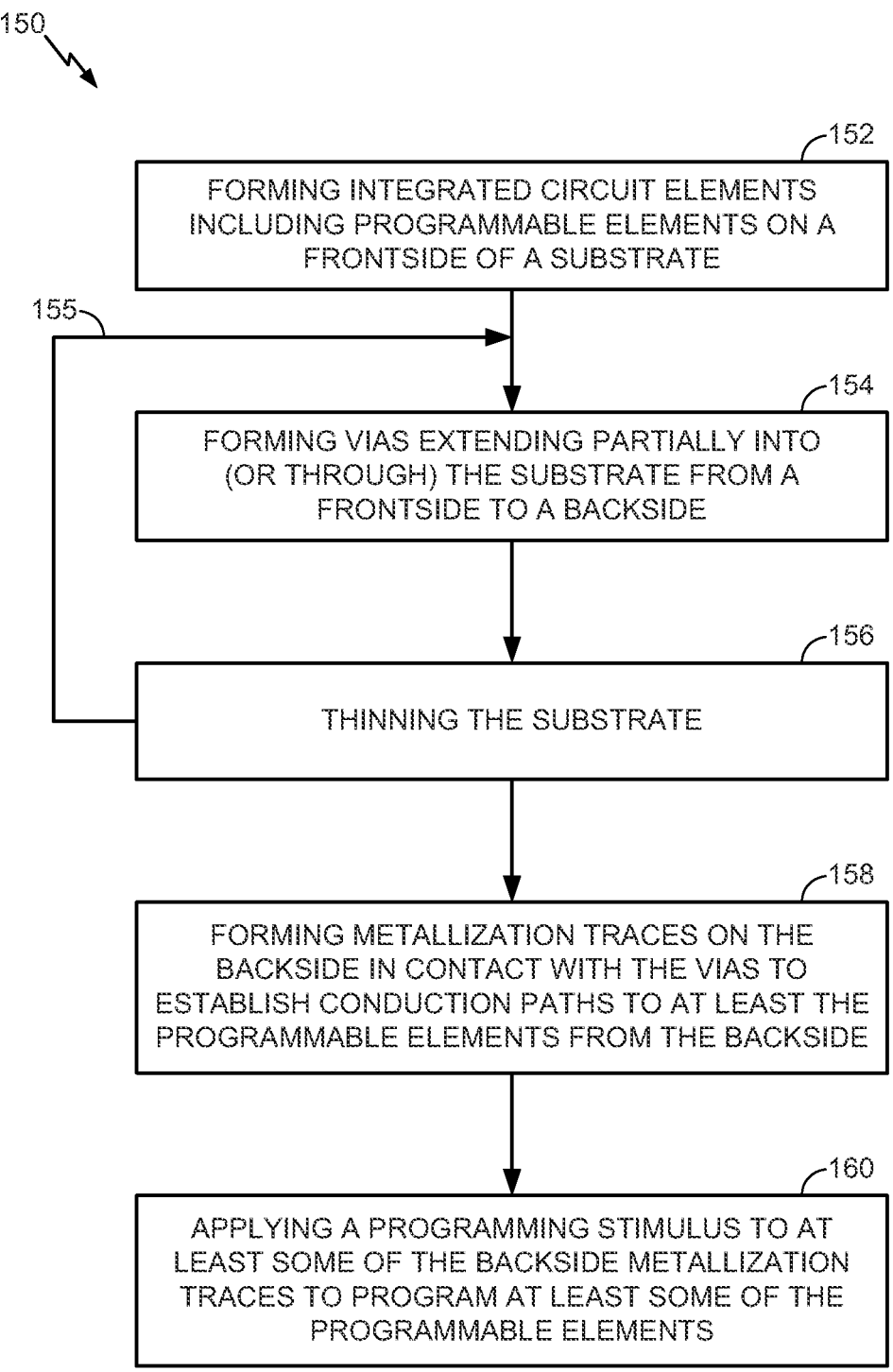
FIG. 3 is a flow diagram showing a method for making an integrated circuit product of the type having elements on a frontside of a semiconductor chip that may be programmed using backside TSV contacts.

An embodiment 150 for making an integrated circuit product is illustrated in FIG. 3, to which reference is now additionally made. The method 150 includes forming integrated circuit elements including programmable elements on a frontside of a substrate. Vias (which may be TSVs) are formed 152 extending through the substrate from a frontside of the substrate to a backside of the substrate. Metallization traces are formed 154 on the backside of the substrate to establish conduction paths to at least the programmable elements from the backside of the substrate through the vias. A programming stimulus is applied 160 to at least some of the backside metallization traces to program at least some of the programmable elements.

Depending on the process, as noted by arrow 155, the substrate may be thinned 156 before or after the vias are formed. For example, in some processes, the vias may be formed extending only partially into the substrate, followed by a subsequent thinning of the substrate from the backside to expose the vias. In other processes, the substrate may be first thinned, followed by construction of vias that extend entirely through the substrate to be accessible from its backside.

Figure 4:
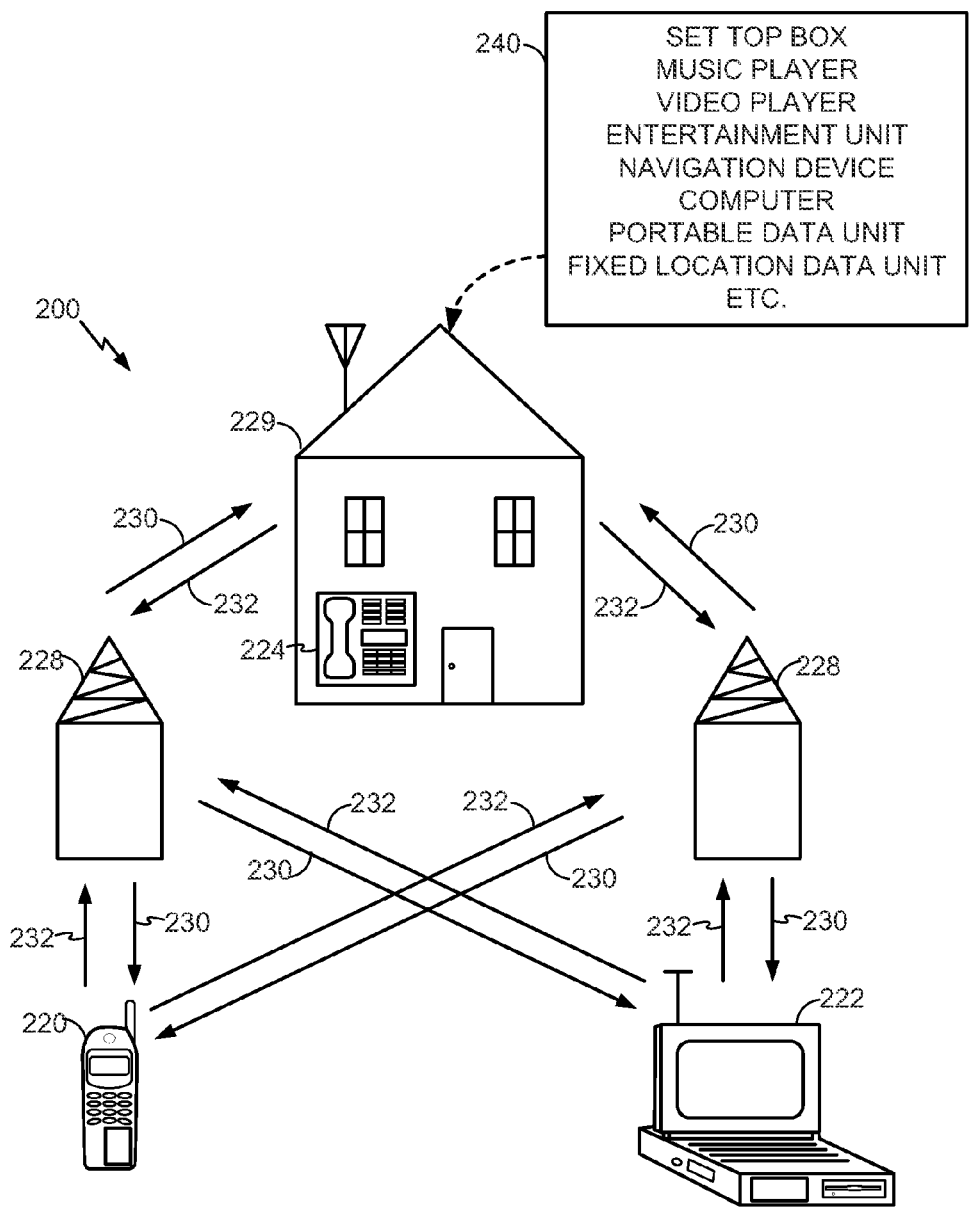
FIG. 4 is an illustration of various environments, including a wireless communication system, in which integrated circuits of the type described herein may be incorporated.

FIG. 4, to which reference is now additionally made, shows an exemplary wireless communication system 200 in which an embodiment of an integrated circuit of the type described herein may be advantageously employed. For purposes of illustration, FIG. 4 shows remote units 220, 222, and 224 and two base stations 228. Typical wireless communication systems, of course, may have many more remote units and base stations. Any of the remote units 220, 222, and 224, as well as the base stations 228, may include an integrated circuit of the type described herein.

FIG. 4 shows forward link signals 230 from the base stations 228 to the remote units 220, 222 and 224 and reverse link signals 232 from the remote units 220, 222, and 224 to base stations 228.

In FIG. 4, remote unit 220 is shown as a mobile telephone, remote unit 222 is shown as a portable computer, and remote unit 224 is shown as a fixed location remote unit in a wireless local loop system, for example, in a house 229 or other structure. The remote units, for instance, may be cell phones, hand-held personal communication systems (PCS) units, portable data units such as personal data assistants, or fixed location data units such as meter reading equipment. Although FIG. 4 illustrates certain exemplary remote units that may include an integrated circuit of the type described herein, the integrated circuit is not limited to these exemplary illustrated remote units. One or more integrated circuits of the type described herein may be suitably employed in any electronic device. For example, the electronic device may also be a set top box, a music player, a video player, an entertainment unit, a navigation device, a computer, a portable data unit, a fixed location data unit, or the like, as shown in box 240 in FIG. 4. Other suitable electronic devices are manifold.

Electrical, connections, couplings, and connections have been described with respect to various devices or elements. The connections and couplings may be direct or indirect. A connection between a first and second electrical device may be a direct electrical connection or may be an indirect electrical connection. An indirect electrical connection may include interposed elements that may process the signals from the first electrical device to the second electrical device.

Although the invention has been described and illustrated with a certain degree of particularity, it should be understood that the present disclosure has been made by way of example only, and that numerous changes in the combination and arrangement of parts may be resorted to without departing from the spirit and scope of the invention, as hereinafter claimed.

The invention claimed is:

1. An apparatus, comprising:
a substrate having a frontside surface and a backside surface;
a programmable element located on said frontside surface; and
a plurality of vias through said substrate configured to provide an electrical connection from said backside surface to said programmable element on said frontside surface, wherein each of said plurality of vias couple to sacrificial contacts on said backside surface, said sacrificial contacts configured to only be used for programming, and wherein said programmable element is configured to be programmed by a programming stimulus selectively applied to said plurality of vias from said sacrificial contacts on said backside surface.

2. The apparatus of claim 1, wherein said programmable element is an anti-fuse.

3. The apparatus of claim 1, wherein said programmable element is a fuse.

4. The apparatus of claim 3, wherein said fuse is a polysilicon fuse.

5. The apparatus of claim 3, wherein said fuse is a metal fuse.

6. The apparatus of claim 1, wherein said programmable element is a programmable read-only memory (PROM).

7. The apparatus of claim 1, wherein said programmable element is a resistive random-access memory (RRAM).

8. The apparatus of claim 1, wherein said programmable element is a magnetic random-access memory (MRAM).

9. The apparatus of claim 1, further comprising a conductive layer on said backside surface to facilitate connection to said plurality of vias.

10. The apparatus of claim 9, wherein said conductive layer comprises copper.

11. The apparatus of claim 9, wherein said conductive layer comprises tungsten.

12. The apparatus of claim 9, wherein said conductive layer comprises aluminum.

13. The apparatus of claim 9, wherein said conductive layer is a metallization layer.

14. The apparatus of claim 1, wherein said substrate is a material selected from the group consisting of gallium arsenide, indium phosphide, silicon germanium, gallium indium arsenide, silicon on glass, silicon on sapphire, silicon on ceramic, glass, sapphire, ceramic, Bismaleimide-Triazine (BT), epoxy, and epoxy blends.

15. The apparatus of claim 1, wherein said substrate is a silicon substrate.

16. The apparatus of claim 15, wherein said plurality of vias are through-silicon-vias (TSVs) formed in said silicon substrate.

17. The apparatus of claim 1, integrated into a device selected from the group consisting of a mobile phone, a set top box, a music player, a video player, an entertainment unit, a navigation device, a computer, a hand-held personal communication systems (PCS) unit, a portable data unit, and a fixed location data unit.

18. The apparatus of claim 1, wherein said programmable element can be programmed by said programming stimulus to one or more of repair said apparatus, effect redundancy in said apparatus, configure functionality of said apparatus, create one or more of a serialization or an identification to uniquify said apparatus, or enable options to integrate said substrate into a three dimensional stack.

19. A method for customizing an integrated circuit, comprising:
providing a substrate having a frontside surface and a backside surface;
forming a plurality of vias through said substrate to provide an electrical connection from said backside surface to a programmable element located on said frontside surface, wherein forming said plurality of vias comprises coupling each of said plurality of vias to sacrificial contacts on said backside surface, said sacrificial contacts configured to only be used for programming; and applying a programming stimulus to said plurality of vias from said sacrificial contacts on said backside surface to program said programmable element to establish a functionality of said integrated circuit.

20. The method of claim 19 wherein said programmable element is a fuse.

21. The method of claim 19 wherein said programmable element is an antifuse.

22. The method of claim 19 wherein said programmable element is a programmable read-only memory (PROM).

23. The method of claim 19 wherein said programmable element is a resistive random-access memory (RRAM).

24. The method of claim 19 wherein said programmable element is a magnetic random-access memory (MRAM).

25. The method of claim 19 wherein said providing said substrate comprises providing a silicon substrate.

26. The method of claim 25 wherein said forming said plurality of vias comprises forming through-silicon-vias (TSVs) in said silicon substrate.

27. The method of claim 19 wherein said functionality of said integrated circuit includes one or more of a repair of said integrated circuit, redundancy effected in said integrated circuit, a configuration to enable or disable one or more of a function or a block of circuitry, or integration of said substrate into a three dimensional stack.

28. The method of claim 19 wherein said functionality of said integrated circuit includes creating one or more of a serialization or an identification to uniquify said integrated circuit or a serialization or an identification to uniquify said substrate in a three dimensional stack of substrates.

29. A method for customizing an integrated circuit, comprising:
providing a substrate having a frontside surface and a backside surface;
forming conductors through said substrate to provide electrical connections from said backside surface to a programmable element located on said frontside surface, wherein forming said conductors includes coupling each of said conductors to sacrificial contacts on said backside surface, said sacrificial contacts configured to only be used for programming; and
applying a programming stimulus to said conductors from said sacrificial contacts on said backside surface to program said programmable element to uniquify said integrated circuit.

30. The method of claim 29 wherein said programmable element is a fuse.

31. The method of claim 29 wherein said programmable element is an antifuse.

32. The method of claim 29 wherein said programmable element is a programmable read-only memory (PROM).

33. The method of claim 29 wherein said programmable element is a resistive random-access memory (RRAM).

34. The method of claim 29 wherein said programmable element is a magnetic random-access memory (MRAM).

35. The method of claim 29 wherein said substrate comprises a silicon substrate.

36. The method of claim 35 wherein said forming conductors comprises forming through-silicon-vias (TSVs) in said silicon substrate.

37. The method of claim 29 wherein said substrate comprises a material selected from the group consisting of gallium arsenide, indium phosphide, silicon germanium, gallium indium arsenide, silicon on glass, silicon on sapphire, silicon on ceramic, glass, sapphire, ceramic, Bismaleimide-Triazine (BT), epoxy, and epoxy blends.

38. The method of claim 29 wherein applying said programming stimulus to program said programmable element to uniquify said integrated circuit comprises creating one or more of a serialization or an identification of said integrated circuit.

39. The method of claim 38 wherein applying said programming stimulus to program said programmable element to uniquify said integrated circuit comprises creating one or more of a serialization or a three dimensional level identification to uniquify said substrate in a stack of substrates.

40. A method for making an integrated circuit product, comprising:
forming integrated circuit elements including one or more programmable elements located on a frontside surface of a substrate;
forming a plurality of vias through said substrate to establish conduction paths from a backside surface to at least one of said one or more programmable elements on said frontside surface, wherein each of said plurality of vias couple to sacrificial contacts on said backside surface, said sacrificial contacts configured to only be used for programming; and
applying at least one programming stimulus to at least one of said plurality of vias from said sacrificial contacts on said backside surface to program said at least one of said one or more programmable elements to establish a functionality of said integrated circuit product.

41. The method of claim 40 wherein said one or more programmable elements include a fuse.

42. The method of claim 40 wherein said one or more programmable elements include an antifuse.

43. The method of claim 40 wherein said one or more programmable elements include a programmable read-only memory (PROM).

44. The method of claim 40 wherein said one or more programmable elements include a resistive random-access memory (RRAM).

45. The method of claim 40 wherein said one or more programmable elements include a magnetic random-access memory (MRAM).

46. The method of claim 40 wherein said substrate comprises a material selected from the group consisting of gallium arsenide, indium phosphide, silicon germanium, gallium indium arsenide, silicon on glass, silicon on sapphire, silicon on ceramic, glass, sapphire, ceramic, Bismaleimide-Triazine (BT), epoxy, and epoxy blends.

47. The method of claim 40 wherein said substrate is a silicon substrate and said forming said plurality of vias comprises forming through-silicon-vias (TSVs) in said silicon substrate.

48. The method of claim 40 wherein said forming said plurality of vias comprises forming said plurality of vias to partially extend into said frontside surface of said substrate and subsequently thinning said substrate to expose said plurality of vias from said backside surface.

49. The method of claim 40 wherein said forming said plurality of vias comprises thinning said substrate and subsequently forming said plurality of vias to extend through said substrate.

50. An apparatus, comprising:
means for applying a programming stimulus to a plurality of vias formed through a substrate having a frontside surface and a backside surface, wherein each of said plurality of vias couple to sacrificial contacts on said backside surface, said sacrificial contacts configured to only be used for programming, and wherein said programming stimulus is applied to said plurality of vias from said sacrificial contacts on said backside surface; and means for programming a programmable element located on said frontside surface using said programming stimulus applied to said plurality of vias, wherein said plurality of vias provide an electrical connection from said backside surface to said programmable element located on said frontside surface.

51. The apparatus of claim 50 wherein said programmable element is a fuse.

52. The apparatus of claim 50 wherein said programmable element is an antifuse.

53. The apparatus of claim 50 wherein said programmable element is a programmable read-only memory (PROM).

54. The apparatus of claim 50 wherein said programmable element is a resistive random-access memory (RRAM).

55. The apparatus of claim 50 wherein said programmable element is a magnetic random-access memory (MRAM).

56. The apparatus of claim 50 wherein said substrate is a silicon substrate and said plurality of vias are through-silicon-vias (TSVs) formed in said silicon substrate.

57. The apparatus of claim 50 wherein said substrate is a material selected from the group consisting of gallium arsenide, indium phosphide, silicon germanium, gallium indium arsenide, silicon on glass, silicon on sapphire, silicon on ceramic, glass, sapphire, ceramic, Bismaleimide-Triazine (BT), epoxy, and epoxy blends.

58. The apparatus of claim 50, integrated into a device selected from the group consisting of a mobile phone, a set top box, a music player, a video player, an entertainment unit, a navigation device, a computer, a hand-held personal communication systems (PCS) unit, a portable data unit, and a fixed location data unit.

59. The apparatus of claim 50 wherein said means for programming uses said programming stimulus to one or more of repair said apparatus, effect redundancy in said apparatus, configure functionality of said apparatus, create one or more of a serialization or an identification to uniquify said apparatus, or enable options to integrate said substrate into a three dimensional stack.

60. A computer readable medium comprising at least one instruction for causing a machine to:

apply a programming stimulus to a plurality of vias formed through a substrate having a frontside surface and a backside surface, wherein each of said plurality of vias connect to sacrificial contacts on said backside surface, said sacrificial contacts configured to only be used for programming, and wherein said programming stimulus is applied to said plurality of vias from said sacrificial contacts on said backside surface; and program a programmable element located on said frontside surface using said programming stimulus applied to said plurality of vias, wherein said plurality of vias provide an electrical connection from said backside surface to said programmable element located on said frontside surface.

61. The computer readable medium of claim 60 wherein said programming stimulus programs said programmable element to one or more of repair said machine, effect redundancy in said machine, configure functionality of said machine, create one or more of a serialization or an identification to uniquify said machine, or enable options to integrate said substrate into a three dimensional stack.

62. The method of claim 40 wherein said functionality of said integrated circuit product includes one or more of a repair of said integrated circuit product, redundancy effected in said integrated circuit product, a configuration to enable or disable one or more of a function or a block of said integrated circuit elements, or integration of said substrate into a three dimensional stack of substrates.

63. The method of claim 40 wherein said functionality of said integrated circuit product includes creating one or more of a serialization or an identification to uniquify said integrated circuit product or a serialization or an identification to uniquify said substrate in a three dimensional stack of substrates.

64. The apparatus of claim 1, wherein said programmable element is formed in a keep out area around at least one of said plurality of vias formed through said substrate.

65. The apparatus of claim 1, wherein said frontside surface is a side of said substrate receiving one or more standard device process steps and wherein said backside surface is a side of said substrate opposite said frontside surface.

66. The apparatus of claim 1, further comprising:

a plurality of conductive contacts on said frontside surface, wherein said plurality of conductive contacts each connect to said programmable element on a first side and connect to a respective one of said plurality of vias on a second side.

* * * * *